United States Patent [19]

Douglas et al.

[11] Patent Number: 5,235,221

[45] Date of Patent: Aug. 10, 1993

[54] FIELD PROGRAMMABLE LOGIC ARRAY WITH SPEED OPTIMIZED ARCHITECTURE

[75] Inventors: Kurt P. Douglas; Paul S. Zagar; Varadarajan L. Narasimhan, all of Boise, Id.

[73] Assignee: Micron Technology, Inc., Boise, Id.

[21] Appl. No.: 865,007

[22] Filed: Apr. 8, 1992

[51] Int. Cl.[5] ............................ H03K 19/177
[52] U.S. Cl. .............................. 307/465; 307/443; 307/202.1
[58] Field of Search .................. 307/202.1, 443, 465, 307/468–469

[56] References Cited

U.S. PATENT DOCUMENTS

| | | | |
|---|---|---|---|
| 3,287,702 | 11/1966 | Borck, Jr. et al. | |
| 3,287,703 | 11/1966 | Slotnick . | |
| 3,296,426 | 1/1967 | Bau . | |
| 3,313,926 | 4/1967 | Minnick . | |
| 3,423,646 | 6/1969 | Cubert et al. | 317/234 |
| 3,462,742 | 8/1969 | Millen et al. . | |
| 3,473,160 | 10/1969 | Wahlstrom . | |
| 3,514,543 | 11/1970 | Crawford et al. | 340/324 |
| 3,535,498 | 10/1970 | Smith, Jr. . | |
| 3,566,153 | 2/1971 | Spencer, Sr. | 307/468 |
| 3,602,733 | 8/1971 | Aoki | 307/209 |
| 3,702,985 | 11/1972 | Probsting | 340/166 R |
| 3,737,866 | 6/1973 | Gruner | 340/172.5 |
| 3,757,306 | 9/1973 | Boone | 340/172.5 |
| 3,769,525 | 10/1973 | Foss et al. | 307/254 |
| 3,774,171 | 11/1973 | Regetz | 365/105 |
| 3,792,242 | 2/1974 | Preel | 307/209 |
| 3,795,901 | 3/1974 | Boehm et al. | 340/172.5 |
| 3,798,606 | 3/1974 | Henle et al. | 340/172.5 |
| 3,803,587 | 4/1974 | Mead | 340/336 |
| 3,816,725 | 6/1974 | Greer | 364/716 |
| 3,818,252 | 6/1974 | Chiba et al. | 307/303 |
| 3,818,452 | 6/1974 | Greer | 340/825.83 |
| 3,832,489 | 8/1974 | Krishna | 178/71 |
| 3,849,638 | 11/1974 | Greer | 364/716 |
| 3,906,255 | 9/1975 | Mensch, Jr. | 307/448 |
| 3,912,947 | 10/1975 | Buchanan | 307/269 |
| 3,924,243 | 12/1975 | Vermeulen | 364/900 |
| 3,967,059 | 6/1976 | Moore, III et al. | 178/58 |
| 3,974,366 | 8/1976 | Hebenstreit | 364/716 |
| 3,979,730 | 9/1976 | Bennett et al. | 364/200 |
| 3,983,538 | 9/1976 | Jones | 364/716 |
| 3,987,286 | 9/1976 | Homlager | 235/152 |
| 3,987,410 | 10/1976 | Beausoleil et al. | 340/146.3 |
| 3,990,045 | 11/1976 | Beausoleil et al. | 340/146.3 |
| 4,034,349 | 7/1977 | Momaco et al. | 364/200 |
| 4,034,356 | 7/1977 | Howley et al. | 340/173 |
| 4,037,089 | 7/1977 | Horninger | 235/152 |
| 4,044,312 | 8/1977 | D'Ortenzio | 328/165 |
| 4,078,259 | 3/1978 | Soulsby et al. | 364/900 |
| 4,091,359 | 5/1978 | Rossler | 340/166 R |
| 4,093,998 | 6/1978 | Miller | 364/900 |
| 4,107,785 | 8/1978 | Seipp | 364/900 |
| 4,128,873 | 12/1978 | Lamlaux | 364/200 |
| 4,218,740 | 8/1980 | Bennett et al. | 364/200 |
| 4,422,072 | 12/1983 | Cavlan | 340/825.87 |
| 4,554,640 | 11/1985 | Wong et al. | 364/716 |
| 4,717,912 | 1/1988 | Harvey et al. | 340/825 |

(List continued on next page.)

FOREIGN PATENT DOCUMENTS 1444084  7/1976  United Kingdom .

OTHER PUBLICATIONS

"CMOS EPLD and Gate Arrays" ATMEL High Density UV Erasable Programmable Logic Device, pp. 19 & 24 & 20.

(List continued on next page.)

Primary Examiner—David R. Hudspeth
Attorney, Agent, or Firm—Michael W. Starkweather

[57] ABSTRACT

A programmable logic device (PLD) is disclosed for finding a sum of products or other logic equations. Specifically, there is a PLD which has: 1) a programmable logical AND and programmable logical OR arrays/matrices, similar to a field programmable logic array; and 2) the fully programmable OR array has an optimized signal speed path and non-optimized signal speed path.

20 Claims, 5 Drawing Sheets

U.S. PATENT DOCUMENTS

| | | | |
|---|---|---|---|
| 4,758,746 | 7/1988 | Birkner et al. | 307/465 |
| 4,771,285 | 9/1988 | Agrawal et al. | 340/825.83 |
| 4,847,612 | 7/1981 | Kaplinsky | 340/825.8 |
| 4,963,768 | 10/1990 | Agrawal et al. | 307/465 |
| 4,967,107 | 10/1990 | Kaplinsky | 307/465 |
| 5,012,135 | 4/1991 | Kaplinsky | 307/465 |
| 5,028,821 | 7/1991 | Kaplinsky | 307/465 |
| 5,148,391 | 9/1992 | Zagar | 307/202.1 X |
| 5,166,556 | 11/1992 | Hsu et al. | 307/202.1 X |

OTHER PUBLICATIONS

J. E. Elliott, et al., "Array Logic Processing", IBM Tech. Disclosure Bulletin, vol. 18 No. 21, Jul. 1973, pp. 219 & 220.

H. Fleisher, et al., "Reconfigurable Machine", IBM Tech. Disclosure Bulletin, vol. 16 No. 10 Mar. 1974, pp. 221, 222 & 223.

W. Carr et al., MOS/LSI Design and Applications pp. 229–258.

H. Flersher et al., "An Introduction to Array Logic" IBM J. Research & Development, Mar. 1975 pp. 98–104.

Jones "Array Logic Macros" IBM J. Research and Development Mar. 1975 pp. 120–126.

Andres, "MOS Programmable Logic Arrays" A Texas Instrument Application Report Oct. 1970 pp. 1–13.

Barns et al., Integrated Circuits in Digital Electronics John Wiley & Sons 1975, pp. 412–419 and 84–91 and FIGS. 11–34.

Wood "High Speed Dynamic Programmable Logic Array Chip" IBM J. Res. Develop. Jul. 1975, pp. 379–381.

Boysel, "Memory on a chip: a step toward large-scale Integration" Electronics, Feb. 6, 1967 pp. 93–97.

Wilkes et al., "The design of the control unit of an Electronic Digital Computer" The Institution of Electrical Engineers, Jun. 1957, pp. 121–128.

Mrasek, "PLAs Replace ROMs for Logic Designs" Electronic Design Oct. 25, 1973 pp. 66–70.

Howley et al., "Programmable Logic Array Decoding Technique" IBM Tech. Disclosure Bulletin, vol. 17 No. 10 Mar. 1975–p. 2988.

National Semiconductor Inc. "Data update MOS." Aug. 1972, pp. 86 and 87.

Blakeslee, Digital Design With Standard MSI and LSI, John Wiley and Sons, 1975. pp. 67–77, 94–99, and 104–105.

PAL Handbook, Monolithic Memories, Inc. 1978 p. N/A.

Hutton et al. "A Simplified Summation Array for Cellular Logic Modules" IEEE Trans. on Computers, Feb. 1974 pp. 203–206.

Programmable Logic-A Basic Guide for the Designer, Data I/O Corp. 1983–pp. 20–25.

The TTL Data Book for Design Engineers, Texas Instruments Inc., 1973 pp. 295, 303, 473, 458 and 480.

Ramaswamy et al. "Second Generation PAL Programmars" Wescon/83 Professional Program Session Record, Session 13.

Monolithic Memories Inc. Form 10-K, Oct. 3, 1982 Annual Report Pursuant to Section 13 or 15(d) of the Securities Exchange Act of 1934.

"The Role of Software in the Growth of PLDs" The Technology Research Group Letter, vol. 1, No. 13, Nov. 1985 p. 3.

Teil et al. "A Logic Minimizer for KLSI PLA Design" ACM IEEE Ninteenth Design Automation Conf. Proceedings, Jun. 1982, pp. 156–162.

Marrin, "Programmable Logic Devices Gain Software Support" EDN Feb. 9, 1984, pp. 67–74.

Cole et al., "Next Generation Programmable Logic" Wescon/84. Professional Program Session Record Session 19.

Monolithic Memones Annual Report 1981, Letter to Shareholders p. 2.

"Semicustom IC Update, Field Programmable Logic Devices" Visa from the Valley, Hambrecht & Grist Inc. vol. 3 No. 1, Mar. 1986, pp. 4–7.

Hemel "The PLA: a different kind of ROM" Electronic Design, Jan. 5, 1976 pp. 78–84.

Calvan et al. "FPLA applications-exploring Design Problems and Solutions" pp. 63–69 source and data N/A.

Kidder, The Soul of a New Machine, 1982 pp. 118–128 and 268–269.

Phelps Institutional Research Report on Monolithic Memories, Inc., A publication of Woodman, Kirkpatrick & Gilbrath Aug. 30, '84.

Wood, "High-Speed Dynamic Programmable Logic Array Chip" IBM J. Res. Develop. Jul. 1975, pp. 379–381.

Cavlan et al. "Field PLAS Simplify Logic Designs" reprinted from Electronic Design, Sep. 1, 1975.

Signetics, Bipolar and MOS Memory Data Manual Signetics Inc., pp. 156–165 Jan. 1979.

Dorman "PLAS on MPs at times they compete at time they cooperate" Electronic Design, 18 Sep., 1976, pp. 24–30.

Elliot et al. "Array Logic Processing" IBM Tech. Disclosure Bulletin, vol. 16, No. 2 Jul. 1973 pp. 586–587.

MacWorld, The Macintoch Magazine, May–Jun. 1984.

"Programmable Logic Arrays" MOS/LSI Design and Application, p. 102.

H. Fleisher et al. "An Introduction to Array Logic" IBM J. Res. Development, p. 132.

"User-Programmable Logic Devices Add Eraciability and Hit New Density Levels", Electronic Products, p. 276.

Use of Laser Mechanism in printers breaks Price and Maintenance barriers, Jan. 15, '85 p. 277.

FIELD PROGRAMMABLE LOGIC ARRAY WITH SPEED OPTIMIZED ARCHITECTURE

CROSS-REFERENCES TO RELATED APPLICATIONS

U.S. Pat. app. Ser. No. 07/817,167, filing date Jan. 6, 1992, is a CMOS logic cell for high-speed, zero-power programmable array logic devices, having common assignee with present invention.

U.S. Pat. app. Ser. No. 837,175, filed Feb. 14, 1992, is a coupling or programming element, also having common assignee.

FIELD OF THE INVENTION

This invention relates to field programmable logic arrays (FPLA); particularly, an FPLA having a fully programmable OR array which has a speed optimization path and a non-optimized signal speed path.

BACKGROUND OF THE INVENTION

Currently, there are several basic PLAs available on the market. A first group of PLAs, field programmable logic arrays (FPLA), has both a programmable AND array and a programmable OR array, which can be programmed for specific sum of products calculations.

Referring to FIG. 1, a field programmable logic array (FPLA) 10 is made of the following elements: input bus 12, programmable matrix 14, logical AND gates 16, programmable matrix 16, logical OR gates 20, and output bus 22.

The advantage of this configuration gives the FPLA user the option of providing, or not, a connection between any one of the input signals from bus 12 to any one of the output lines of bus 22 via programmable matrix 14, logical AND gates 16, programmable matrix 18, and logical OR gates 20.

The user can provide each logical AND gate and each logical OR gate a unique output signal dependent on a particular set of input signals. The output signals from the FPLA provides for a programmable "sum of products terms."

A second group of PLAs, is known as a programmable array logic devices, known as a PAL, which is a registered trademark of Advanced Micro Devices Inc. A PAL has a programmable AND array and a fixed OR array.

Both the FPLA and PAL architectures have relative advantages and disadvantages. The FPLA offers a high degree of functional flexibility. The PAL has a fast operating speed. The FPLA is slower since a programmable OR array is slower than a dedicated OR array. Similarly, the PAL does not have the flexibility provided by the FPLA.

Some attempts have been made to combine both functional flexibility and speed. However, such attempts usually ended by sacrificing circuit density for functionality while not providing the speed available from a PAL.

Therefore, a need exists for an IC which has the speed of a PAL and the flexibility of a FPLA.

SUMMARY OF THE INVENTION

The present invention provides an IC which has the speed of a PAL and the flexibility of an FPLA. Specifically, the invention provides for a number of product term outputs, from a fully programmable AND array, which are configured to provide direct inputs to a programmable OR logic circuit generating one of the OR array outputs. Remaining product term outputs are programmably selectable through OR circuitry into the same OR gate circuit for output with some additional delay. Thus, a number of product terms associated with each output have been optimized for fewer gate delays, while the flexibility of the fully programmable OR array has been retained. In other words, there is an IC having speed and flexibility.

Features of the present invention will become clear from the following detailed description of the invention, taken in conjunction with the accompanying drawings.

DETAILED DESCRIPTION OF THE ILLUSTRATED EMBODIMENT

Incorporated Material

For the purpose of providing background material and illustrating a feeling for the state of the art, the following books are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872 .L64 P44 1991.

The following U.S. patents and applications are herein incorporated by reference: U.S. Pat. No. 3,423,646, is a computer logic device consisting of an array of tunneling diodes, isolators and short circuits. U.S. Pat. No. 4,124,899, is a programmable array logic circuit. U.S. Pat. No. 4,717,912, an apparatus for producing any one of a plurality of signals at a single output. U.S. Pat. No. 4,758,746, is a programmable logic array with added array of gates and added output routing flexibility.

BROAD CONCEPT

It is noted that in the following discussions, the term "array" is often used as referring to groupings or divisions of logical OR gates. Although, technically, these groupings taken together form a single logical OR array.

Figure 1:
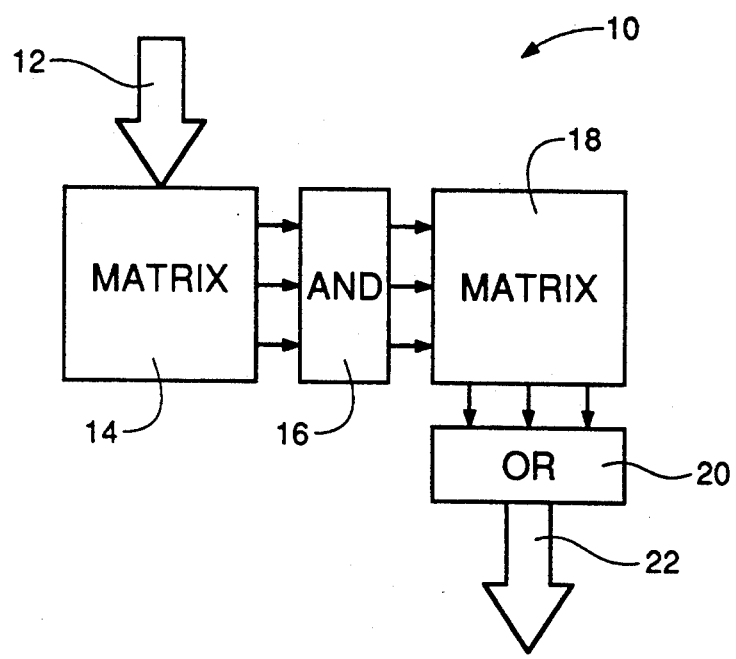
FIG. 1 is a field programmable logic array (FPLA) such as is known in the prior art.
Figure 2:
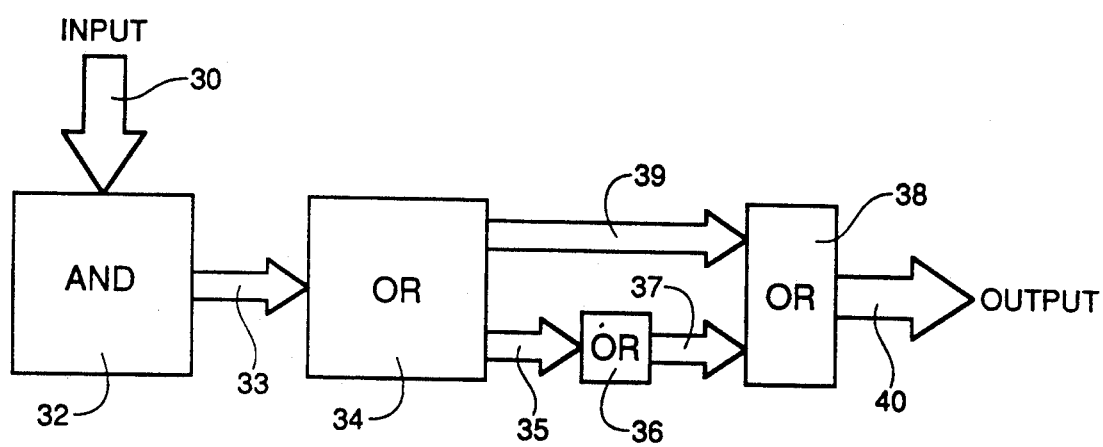
FIG. 2 is a block diagram of the present invention.

FIG. 2 is a block diagram of the preferred invention. Input bus 30 leads to programmable AND array 32 which routs, via bus 33, information to programmable OR plane 34 where processed signals are bused to either 1) a plurality of logical OR gates or OR array 38, via bus 39, which leads to output bus 40; or 2) a plurality of cascaded logical OR gates or OR array 36, via bus 35, which leads to array 38, via bus 37, before being outputed via bus 40.

It is also noted that circuit routing over bus 39 is an optimized speed path; much faster than an FPLA architecture. Moreover, circuit routing through bus 35, OR array 36, bus 37, and OR array 38 is a slower speed path as a result of the increased logical gates. However, this slower path allows for more combinations of sum of products terms. This will be discussed further under FIGS. 3a and 3b.

It is further noted that arrays 34, 36, and 38 combine and form what is typically described as a single fully programmable OR array. Thus, this invention can be characterized as a FPLA, although there are optimized speed paths heretofore not found on FPLAs. Although this invention is segmented into multiple OR divisions, 34, 36, and 38, this configuration is strictly for discussion purposes.

SPECIFIC ILLUSTRATIVE EMBODIMENT

Figure 3A:
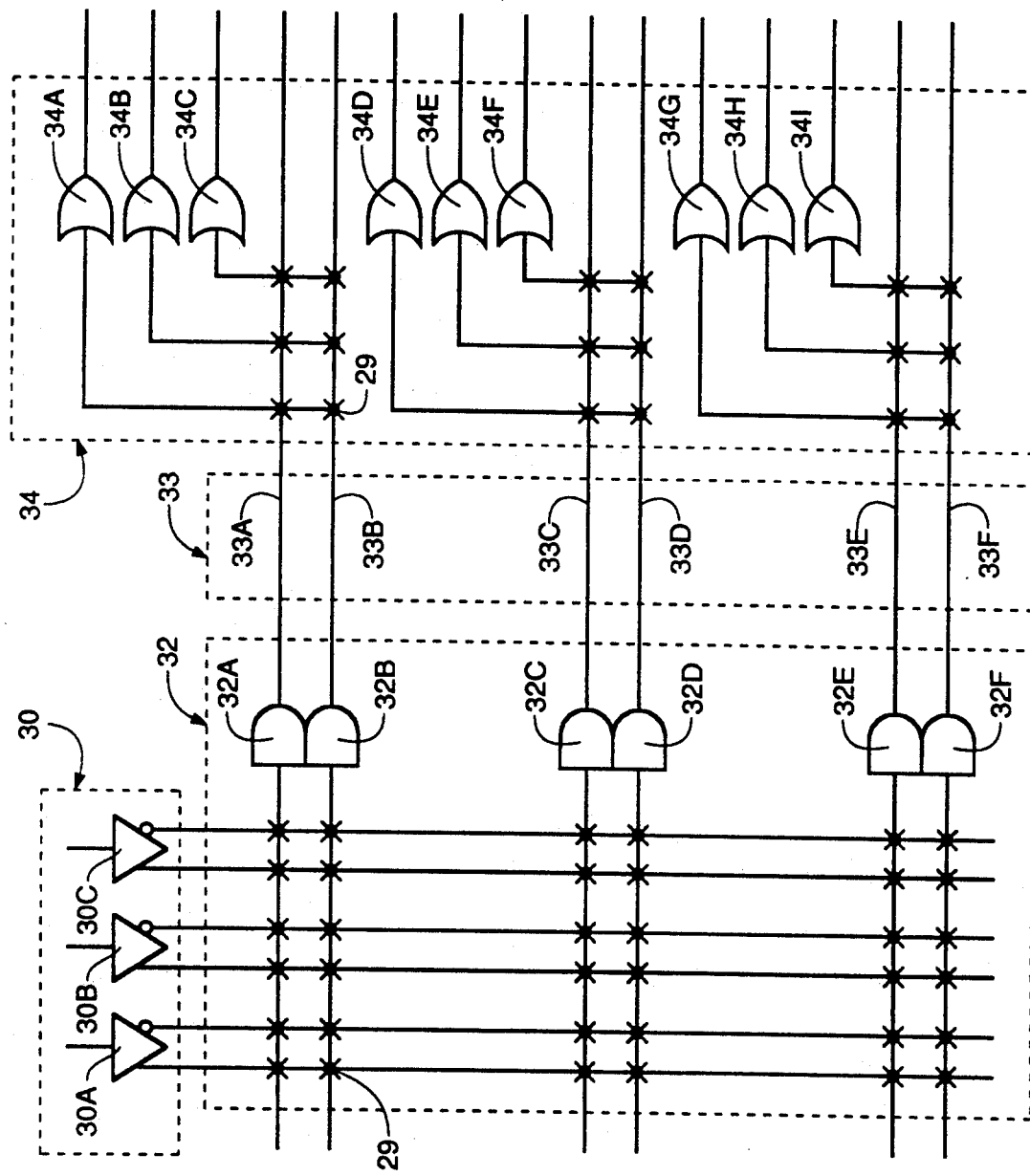
FIGS. 3a and 3b illustrate one detailed embodiment of the invention.
Figure 3B:
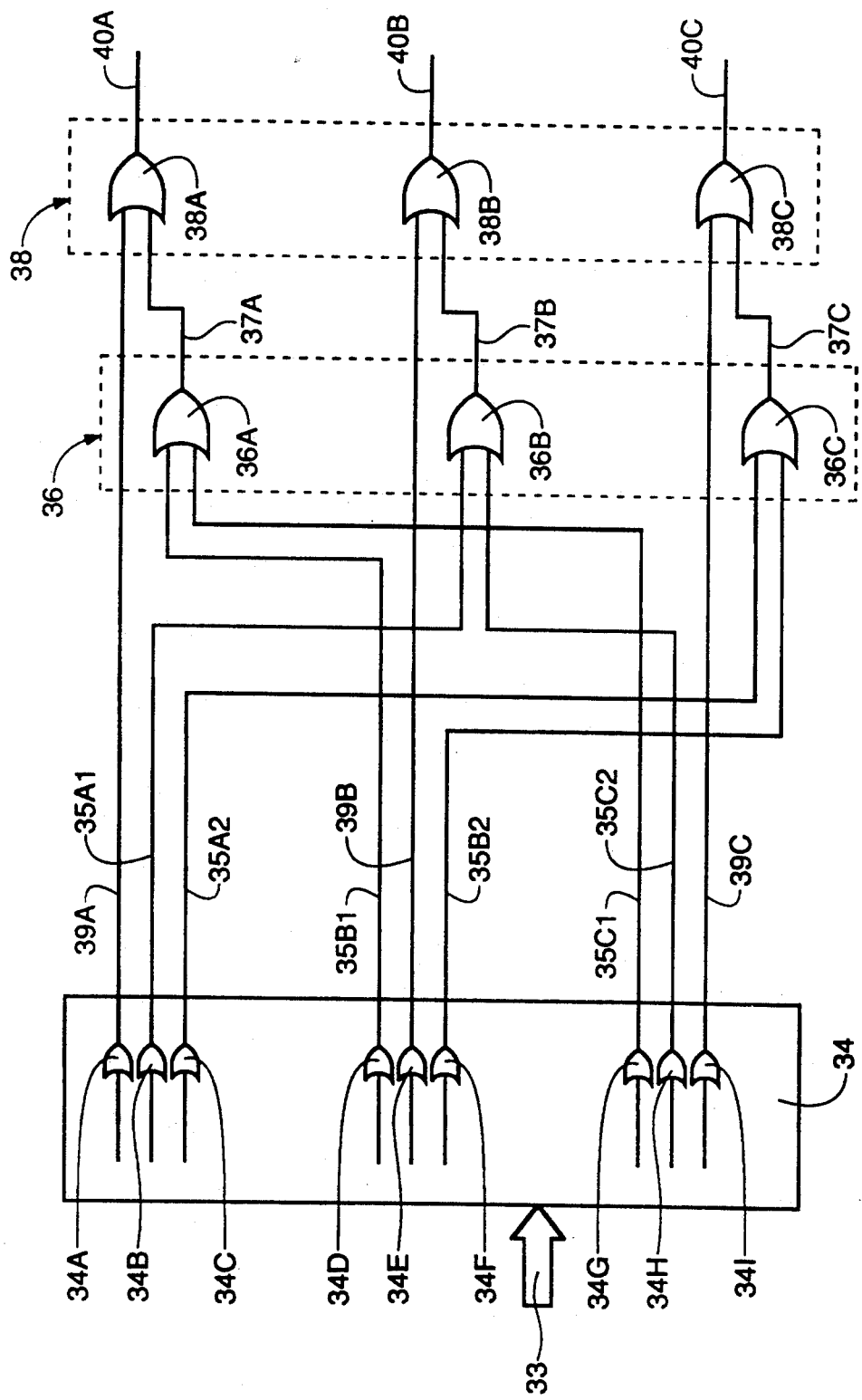

FIGS. 3a and 3b make up a detailed illustration of the broad invention of FIG. 2.

Referring to FIGS. 3a and 2, input bus 30 comprises the following: Buffers 30A-C each having two output lines which send one inverted and one non-inverted (normal) signal. AND array 32 comprises programmable elements, typified as 29, which determines if two intersecting lines will be coupled or not, like 30A to 32A. AND array 32 also comprises logical AND gates 32A-F. Bus 33, comprising lines 33A-F, couples AND array 32 to OR array 34. OR array 34 Comprises programmable elements, also typified by 29, and logic OR gates 34A-I.

Referring to FIGS. 3b and 2, bus 39 comprises lines 39A-C; bus 35 comprises lines 35A1-2, 35B1-2, and 35C1-2. Logical OR array 36, comprises two-input logical OR gates 36A-C. Bus 37 comprises lines 37A-C. Logical OR array 38 comprises two-input logical OR gates 38A-C. Bus 40 comprises lines 40A-C.

One skilled in the art will notice that for every product term from bus 33 there will be an optimized signal speed path to an output line in bus 40. Specifically, for example, one optimized path begins at register 30A couples to gate 32A, via an appropriate programmable element, whereby, gate 32A is coupled to gate 34A, via line 33A, wherein, output line 40A is coupled to gate 34A via line 39A and gate 38A.

For more logic programming flexibility, a less speed optimized path, or a non-optimized signal speed path, can be chosen. For example, referring to the previous example, it would take longer if the output from gate 32A were coupled to output line 40B via line 33A, gate 34B, line 35A1, gate 36B, line 37B, logic gate 38B, and output line 40B. Thus, the non-optimized paths have more logical gated delays than the optimized paths.

This more flexible embodiment, as illustrated in FIGS. 3a-b, allows for any six product terms to be summed to any of the three outputs 40A-C. Furthermore, each output has two associated products that are summed to it over a speed optimized path of bus 39. However, if speed is of less importance and creating other combinations with the remaining product terms, then the circuit path follows bus 35, OR plane 36, bus 37 and OR plane 38. Therefore, there is provided an IC which has a speed optimized path as well as having flexibility to create other combinations of sum of products utilizing non-optimized signal speed paths.

Figure 4:
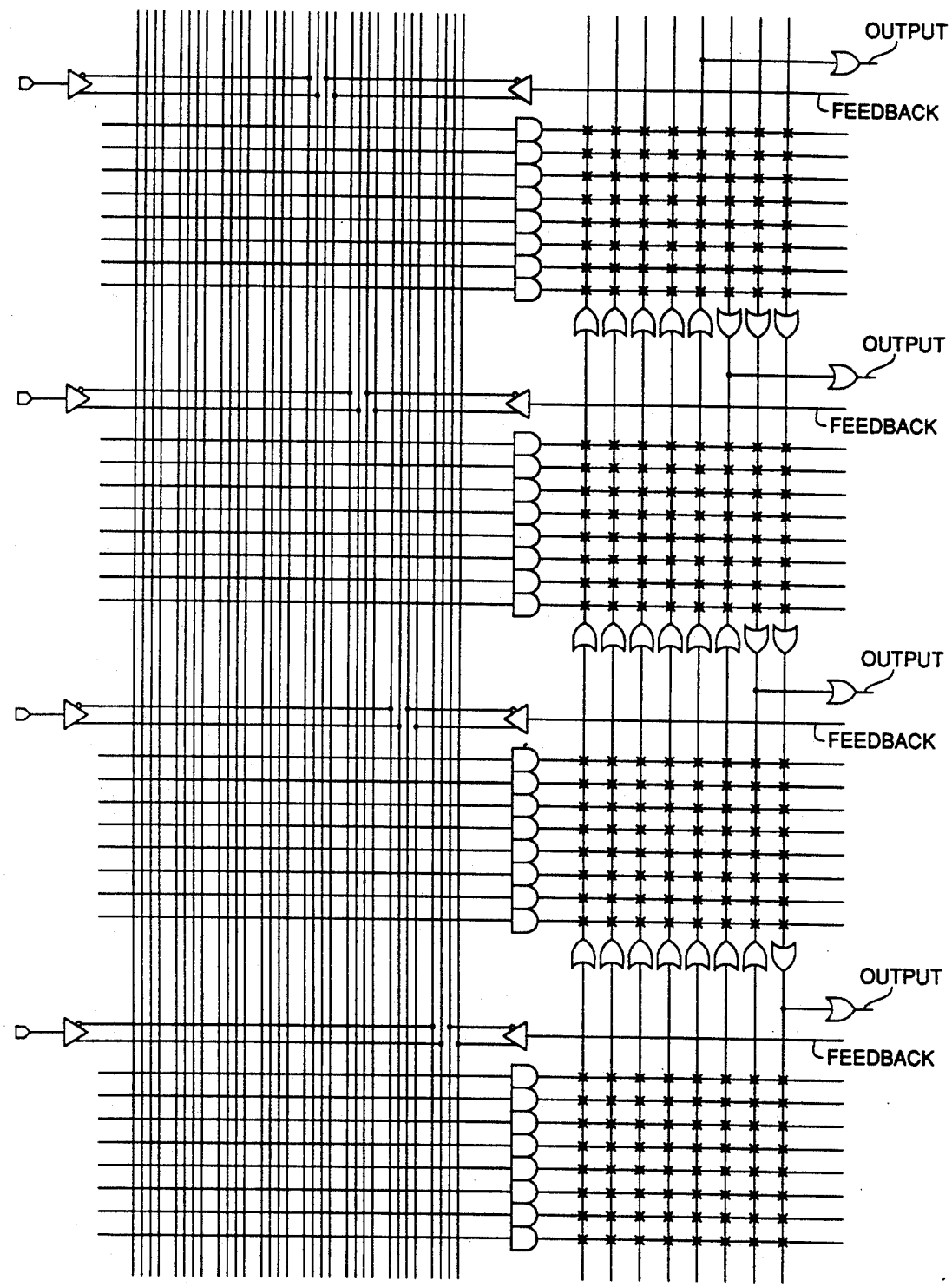
FIG. 4 is a specific implementation of the invention.

FIG. 4 illustrates a representative portion of a specific embodiment of the invention. It is noted that the logic gates and matrices are showing general logical signal routings.

VARIATIONS IN THE INVENTION

There are several obvious variations to the broad invention and thus come within the scope of the present invention. Variations occur by providing larger AND and OR arrays, i.e. having a 32×64 AND array and a 64×8 OR array. Similarly, logic gates can be grouped by eight instead of the illustrated two (like 32A and 32B). Moreover, with these larger arrays, OR array 36 will have larger cascading sequencing and have longer time delays from more logical OR gates. Additionally, it will be useful to implement logical ORs with larger widths—like 3, 4 or any other number—instead of the illustrated two-input logical OR gates like 36A.

It is noted that the cascaded logical OR array 36, and array 38 are preferred to be designed using either arrays or static logic, depending upon a specific application for the invention, or the size of the array needed.

It is also a logical variation to have signals from OR array grouping 36 to be re-routed back to either the logical OR array 34 or to array 36 again for the obvious programming advantages. Similarly, signals from OR gates in array 34 may be re-routed back to other OR gates in array 34 for the obvious advantages. These modifications will obviously provide for variability in signal timing and increase efficiency in manufacturing, for example.

It will be readily apparent that any compatible logic, i.e., AND, OR, NAND, NOR, may be utilized.

Remarks about the Invention

Advantages of the circuit diagrammed in FIGS. 2, 3a, and 3b, are 1) the signals are now speed variable, and 2) the OR plane/matrix is now fully programmable.

Signal speed variability offers several advantage. A programmer can now dictate the timing of signals that are to reach output lines 40A-C. Specifically, an input signal will take longer to reach an output destination by routing input signals along a longer path, via OR array 36, consequently going through more logic gates. Similarly, an input signal will take far less time to reach an output destination by routing input signals along a shorter path, via over bus 39, consequently going through fewer logic gates. Therefore, this invention offers a non-optimized signal speed path which offers: 1) variable signal speed paths, each path having different numbers of logical OR gate delays, and 2) equal signal speed paths having an equal number of gate delays before exiting the programmable integrated circuit.

Not only is the optimized speed an advantage but having fully programmable OR plane similarly offers advantages. One skilled in the art will appreciate that by using the present invention a programmer is no longer constrained by a typical fixed OR plane size, which restricts or limits the number of product terms available for a given sum of products. Thus, if a program requires a greater number of product terms there is no need to purchase another chip to get the extra sum of product width. Additionally, a programmer has greater flexibility in programming logic paths or implementing more complex Boolean equations.

While the invention has been taught with specific reference to one embodiment, someone skilled in the art will recognize that changes can be made in form and detail without departing from the spirit and the scope of the invention.

Although subheadings in the Detailed Description of the Preferred Embodiment are used, they are merely provided for assisting the reader; wherein, the writer is free to enter any information under any heading/s.

I claim:

1. An integrated circuit, comprising:
   a) a plurality of circuit input lines;

b) a plurality of logical AND gates;

c) a first programmable matrix, coupling said plurality of input lines to the inputs of said plurality of logical AND gates;

d) a first plurality of logical OR gates, each OR gate having only a single output line, capable of coupling to only a single input of a single device;

e) a second programmable matrix, coupling the outputs of said plurality of logical AND gates to the inputs of said first plurality of logical OR gates;

f) a second plurality of logical OR gates, each of the second plurality of logical OR gates having only a first and second input, the first input coupled directly to the single output of one of said first plurality of logical OR gates; and g) a third plurality of logical OR gates having only two inputs, each input coupled to a single output from one of said first plurality of logical OR gates, and each of the third plurality of logical OR gates having only one output that is coupled to one of the second inputs from said second plurality of logical OR gates.

2. An integrated circuit as in claim 1, further comprising:

a plurality of output lines coupled to the outputs of said second plurality of logical OR gates.

3. The integrated circuit as in claim 1, wherein said first and second programmable matrices comprise:

an anti-fuse having a dielectric layer for programming particular selectable circuit paths.

4. A programmable logic device, comprising:

a) a plurality of circuit input lines;

b) a first set of logic devices providing for logical AND functioning;

c) a first matrix array coupling input lines to the inputs of said first set;

d) a second set of logic devices providing for logical OR functioning;

e) a second matrix array coupling the outputs of said first set to the inputs of said second set; and f) a third set of logic devices providing for logical OR functioning;

g) a fourth set of logic devices, providing for logical OR functioning, interposed between said second and third set of logic devices, having exclusively all inputs to said fourth set coupled to the outputs of said first set, and each output from said fourth set is exclusively coupled to a single input of a single logic device in said third set.

5. A programmable logic device as in claim 4, wherein:

said first matrix is programmable.

6. A programmable logic device as in claim 4, wherein:

said second matrix is programmable.

7. A programmable logic circuit, comprising:

a) a first plurality of logical OR gates;

b) a plurality of circuit input lines;

c) a programmable matrix, coupling said circuit input lines to the inputs of said first plurality of logical OR gates;

d) a second plurality of logical OR gates having at least one input coupled to at least one output from said first plurality of logical OR gates, and having at least one other input not directly coupled to said first plurality of logical OR gates; and e) a third plurality of logical OR gates having inputs coupled to the outputs of said first plurality of logical OR gates, and having outputs coupled to at least one other input of said second plurality of logical OR gates.

8. A programmable logic circuit as in claim 7, further comprising:

a plurality of circuit output lines coupled to the outputs of said second plurality of logical OR gates.

9. A programmable logic device, comprising:

a) a plurality of logical OR gates;

b) a plurality of output lines coupled to the outputs of some of said plurality of logical OR gates;

c) each of said plurality of output lines having:

i) an optimized signal speed path having a first number of logical OR gate delays; and ii) a non-optimized signal speed path having a second number of logical OR gate delays being larger than said first number of logical OR gate delays.

10. A programmable logic device, comprising:

a) a plurality of logical OR gates;

b) a plurality of signal paths through said plurality of logical OR gates; and c) said plurality of signal paths comprising:

i) a plurality of optimized signal speed paths having a first number of logical OR gate delays; and ii) a plurality of non-optimized signal speed paths having a second number of logical OR gate delays being greater than said first number of logical OR gate delays.

11. The programmable logic device as in claim 10, wherein, said plurality of non-optimized signal speed paths further comprises:

a plurality of equal signal speed paths, where each of said equal signal speed paths have a same number of logical OR gate delays.

12. The programmable logic device as in claim 10, wherein said plurality of logical OR gates comprises:

programmable inputs to said logical OR gates for providing a fully programmable OR matrix.

13. A programmable logic device, comprising:

a) a programmable AND matrix having:

inputs to a programmable matrix array, and groups of AND gates receiving inputs from the programmable matrix; and b) a first plurality of OR gates (38) having:

groups of OR gates therein, where the first group of OR gates has at least one input associated with the first group of AND gates;

at least another second input not directly coupled to a group of AND gates;

c) a second plurality of OR gates, having:

groups of OR gates therein, where the first group of OR gates has no inputs from the first group of AND gates; and the output of at least one of said first group of OR gates being coupled to the another second input to said first group of OR gates.

14. A programmable logic device, comprising:

a) a plurality of AND gates divided into first, second, and third groups;

b) a primary plurality of OR gates divided into first primary, second primary, and third primary groups, having:

the first primary group exclusively electrically associated with the first group of AND gates;

the second primary group exclusively electrically associated with the second group of AND gates;

the third primary group exclusively electrically associated with the third group of AND gates;

c) a secondary plurality of OR gates divided into first secondary (38A), second secondary, and third secondary groups, having:

the first second group having an input exclusively and directly coupled to one of the OR gates from the first primary group, and another input not electrically associated with the first primary group;

the second secondary group having an input exclusively and directly coupled to one of the OR gates from the second primary group, and another input not electrically associated with the second primary group; and the third secondary group having an input exclusively and directly coupled to one of the OR gates from the third primary group, and another input not electrically associated with the third primary group; and d) an intermediate array of OR gates, divided into first intermediate, second intermediate, and third intermediate groups, having:

all inputs of the intermediate array electrically associated with the first OR array, and all outputs of the intermediate array electrically associated with the secondary OR array inputs;

the first intermediate group having no inputs electrically associated to the first primary group of OR gates, and having outputs exclusively electrically associated with the first secondary group of OR gates;

the second intermediate group having no inputs electrically associated to the second primary group of OR gates, and having outputs exclusively electrically associated with the second secondary group of OR gates; and the third intermediate group having no inputs electrically associated to the third primary group of OR gates, and having outputs exclusively electrically associated with the third secondary group of OR gates.

15. The programmable logic device of claim 14, further comprising:

a fourth array of OR gates positioned to receive inputs from the intermediate OR array and to electrically couple the outputs of the fourth array to the secondary OR array inputs.

16. A PLD having inputs, comprising:

a) AND logic means for performing AND logic on the PLD inputs;

b) first OR logic means, coupled to the AND logic means outputs, for performing OR logic on the outputs from the AND logic means, and having outputs;

c) second OR logic means, coupled exclusively to outputs from said first OR logic means, for performing OR logic on the first OR logic means outputs; and d) third OR logic means, coupled exclusively to receive resulting electrical outputs from both said first and said second OR logic means.

17. The PLD of claim 16, wherein said first OR logic means is a set of OR logic gates.

18. The PLD of claim 17, wherein said second OR logic means is a set of OR logic gates.

19. The PLD of claim 18, wherein said AND logic means is a set of AND logic gates.

20. A PLD with inputs, comprising:

a) AND array means, for performing logical AND functions on the PLD inputs;

b) first OR array means, coupled to the outputs of the AND array means, for performing OR functions on the outputs from the AND array;

c) second OR array means, coupled to the outputs of the first OR array exclusively;

d) third OR array means, coupled to both the first and second OR array outputs; and e) optimized path means, coupled to the first OR array, for routing selected optimized signals directly from the PLD inputs to the AND array means, to the first OR array means, directly to the third OR array means, and to the PLD outputs.

* * * * *